United States Patent [19]

Dorak et al.

[11] Patent Number: 5,802,274
[45] Date of Patent: Sep. 1, 1998

[54] CARTRIDGE MANUFACTURING SYSTEM FOR GAME PROGRAMS

[75] Inventors: John Dorak, Boca Raton; Ross L. Cook, Boynton Beach; George G. Gruse, Deerfield Beach; Minhtam Nguyen, Delray Beach; James T. Tsevdos, Fort Lauderdale; Susan Elizabeth Waefler, Delray Beach, all of Fla.

[73] Assignee: International Business Machines Corporation, Armonk, N.Y.

[21] Appl. No.: 237,741

[22] Filed: May 4, 1994

[51] Int. Cl.$^6$ .................................................. G06F 13/00
[52] U.S. Cl. .................................................. 395/186
[58] Field of Search .......................... 395/186, 188.01; 360/69; 340/825.31, 825.34; 364/410; 463/1, 24, 40, 43, 44; 380/3, 4, 23, 28, 30, 42, 43

[56] References Cited

U.S. PATENT DOCUMENTS

| | | | |
|---|---|---|---|
| 4,462,076 | 7/1984 | Smith, III | 364/200 |
| 4,623,920 | 11/1986 | Dufresne et al. | 358/122 |
| 5,371,692 | 12/1994 | Draeger et al. | 364/580 |
| 5,418,713 | 5/1995 | Allen | 364/403 |
| 5,460,374 | 10/1995 | Owaki | 273/148 B |
| 5,497,479 | 3/1996 | Hornbuckle | 395/491 |
| 5,547,202 | 8/1996 | Tsumura | 463/29 |
| 5,548,645 | 8/1996 | Ananda | 380/4 |
| 5,581,270 | 12/1996 | Smith et al. | 345/2 |
| 5,581,763 | 12/1996 | Hait | 395/186 |

Primary Examiner—Robert W. Beausoliel, Jr.
Assistant Examiner—Stephen C. Elmore
Attorney, Agent, or Firm—Morgan & Finnegan, LLP; Joseph C. Redmond, Jr.; JoAnn Crockatt

[57] ABSTRACT

A game manufacturing process includes the steps of a customer's game selection being used to initiate the manufacturing process by scanning a bar code from an empty cartridge box to a selection slip. An appropriate cartridge is identified and erased. The manufacturing system then writes the game cartridge with the content data from a game storage computer and sends information to a printer for producing identification and instructional inserts for the game. The game computer has stored therein the game contents for all of the games. After a game-to-be-"burned" indicia is provided to the game storage computer, and a cartridge is installed, the sequence of loading the game and additional identifying information into a flash RAM contained in the cartridge is commenced. The manufacturing system functions so that if timely connections are not made between the game storage computer and a host computer, the game burner application time counter will not be reset by regularly transmitted and expected transactional data, and the system will only operate for a limited period of time and will then cease to function. The operator can request from the host computer a grace period to resume normal operation of the game burning application. This provides some minimum time between connections, but does not permit the game burner application to run without first transmitting sufficient support data to and from the host computer.

6 Claims, 10 Drawing Sheets

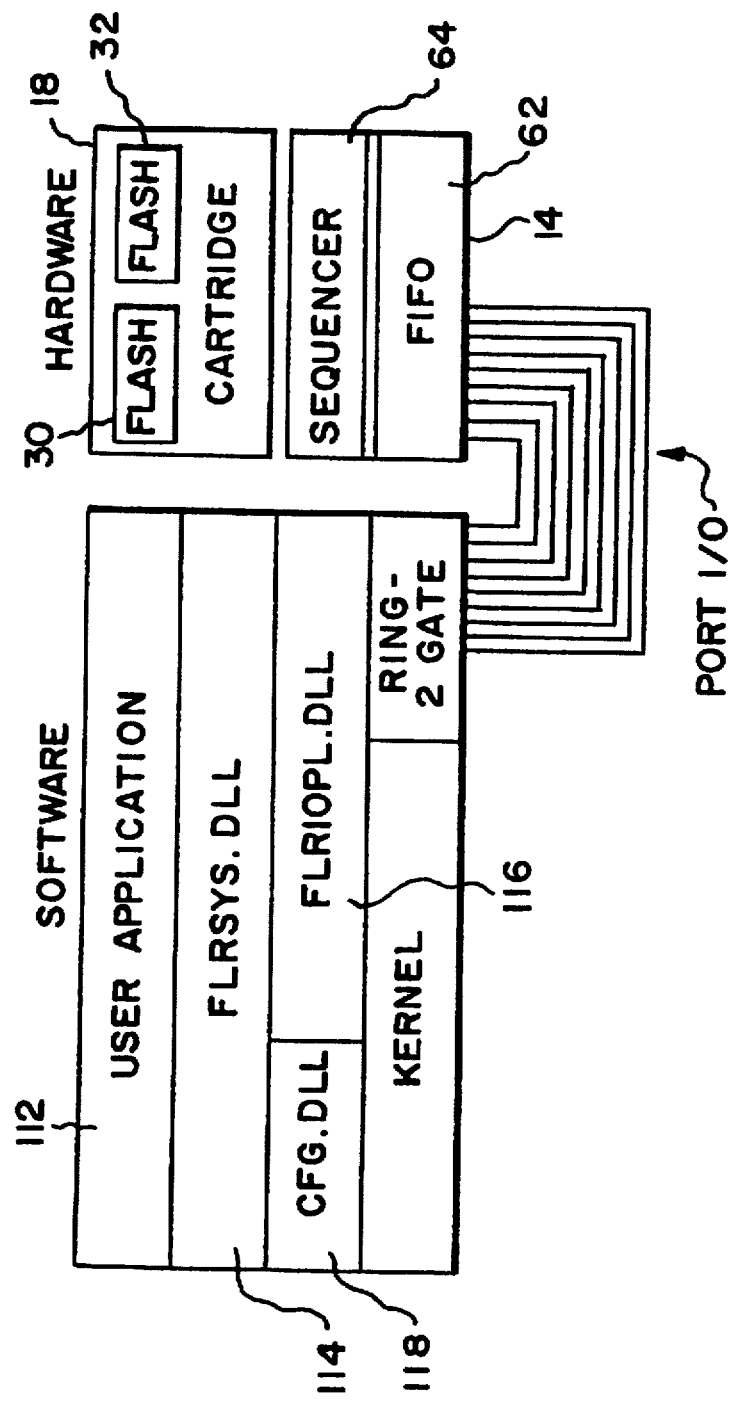

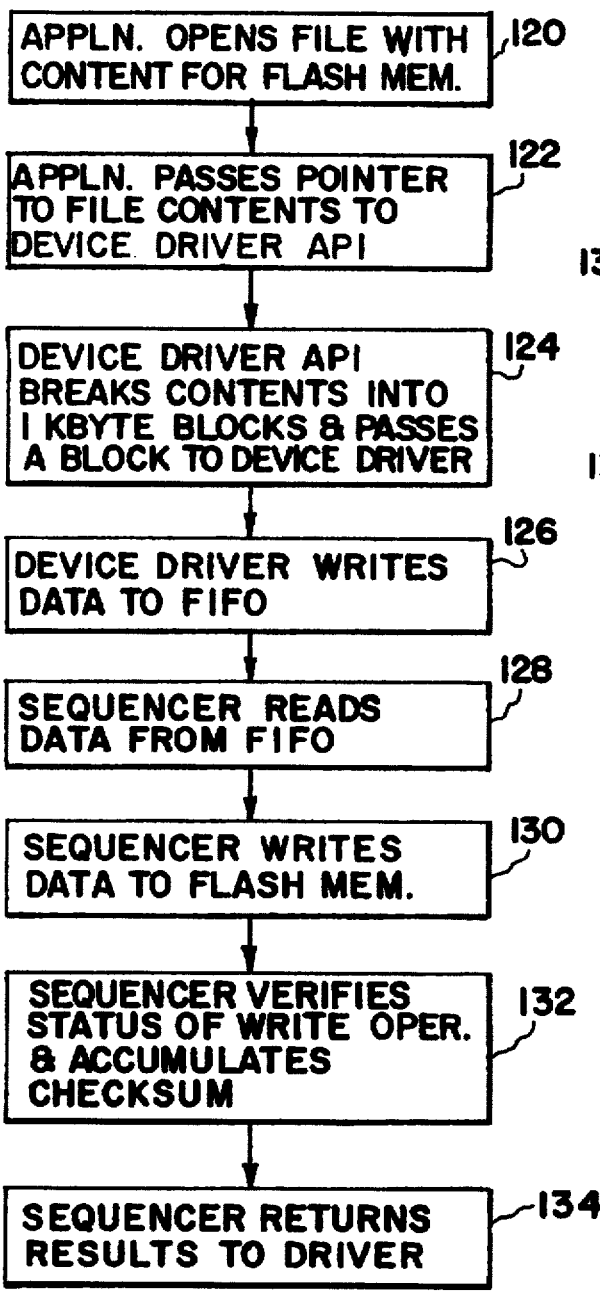
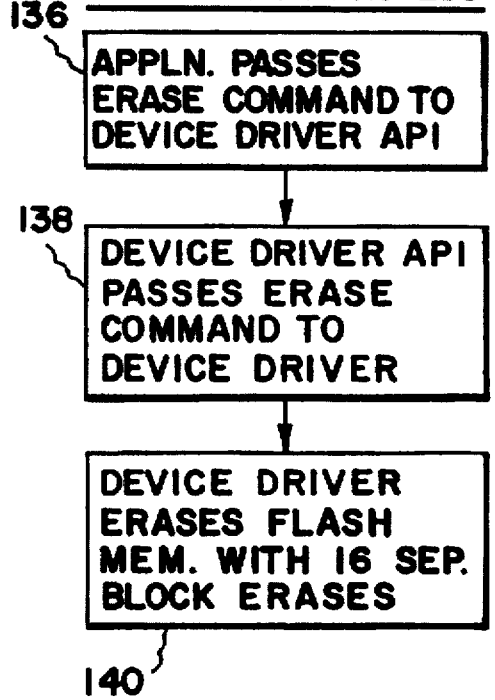
FIG. 10
FIG. 11

CARTRIDGE MANUFACTURING SYSTEM FOR GAME PROGRAMS

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to the field of video and audio data storage and controlled manufacturing of information, and in particular to a manufacturing system for accessing information, including audio and video information, at local and remote stored locations and for communicating in real-time that information to a retail point-of-sale under conditions of accountability and file security for reproduction of the communicated information in a material object for end-user use.

Today there are over 50 million video game players in the United States of America alone. The rental and retail of video game cartridges have evolved into a major market as the number of new games has grown to more than 2,000 titles and game prices continue to rise. Consumer studies show that one of the biggest area of dissatisfaction among game renters and buyers is the difficulty of finding their game choice in stock. Game retailers find it difficult to accurately forecast demand for video games because there are usually no archival records to use as a base. Popularity often rises through the informal "word of mouth" networking among game players. In addition, the window of opportunity for a particular game is very short. A retailer who purchases enough game cartridges to meet peak demand may be left with unsold game cartridges when demand diminishes. The opposite problem occurs when a retailer did not purchase enough game cartridges to meet demand. In this case more cartridges will have to be ordered from the manufacturers. This process could lead to loss of revenue due to very long lead times because the cartridges, which contain mask programmable read only memory (MPROM), are usually produced in limited manufacturing runs and often overseas which delays delivery to the retailer.

Presently, retailers must predict consumer demand for MPROM based game cartridges for the game cartridge rental and retailing business. Usually the prediction is not very accurate particularly if it involves a new game title that has no previous marketing record. Retailers are forced to overstock or understock game cartridges resulting in cash flow problems or loss of sales, both causing loss in total profit. If retailers overstock then they may end up with unusable inventory because MPROM game cartridges are not alterable. On the other hand, understocking causes loss in rental or sale revenue because retailers cannot satisfy consumer demand. Further, the efficiencies of programming MPROM, or reprogramming EPROM or EEPROM are such that they are not ideal for on-demand retailing operations.

SUMMARY OF THE INVENTION

The game programming system uses rewritable cartridges that are compatible with commercially available game systems (for example, Sega™ and Nintendo™ systems) to produce game cartridges at the point-of-sale or rental location. It satisfies the renter or buyer by providing just in time delivery of the desired game. Retailers only have to keep sufficient uniquely designed game blanks on hand to meet consumer demand. No popularity forecast of any particular game title is necessary.

The invention is comprised of a programming device specifically designed to load digital content from computer storage to program a rewritable game cartridge in an extremely short period of time. The game cartridge is of a design that uses reprogrammable flash memory instead of the traditional MPROM or even EPROM or EEPROM. The combination of the unique flash memory concept and the programming device enables this system to program a rewritable game cartridge in less than 30 seconds. Therefore a game cartridge can be manufactured on-demand resulting in greater customer satisfaction. The retailers only have to stock rewritable cartridges utilizing flash memory with its more idealistic features.

The flash rewritable cartridge also contains identification hardware that allows the programmer to verify it as proprietary to a particular manufacturer or authorized distributor or retailer. The programmer is able to program only those cartridges that are correctly identified thus allowing stringent quality control of the manufacturing process. After the programmer identifies a cartridge as usable, the operator has the option to initialize the cartridge and input additional information such as store location and cartridge type into the flash memory. If initialization is not necessary, then the operator can instruct the programmer to begin loading data from storage to the cartridge.

The flash reprogrammable cartridge readily lends itself to the rental business where a game can be programmed on a cartridge and rented to a customer. The game content can be erased from the cartridge when it is returned, new game content can be programmed and the cartridge can be rented a successive number of times. A sell-through scenario is also envisioned and may present the customer with the opportunity to bring an owner's purchased cartridge back to be reprogrammed with a new game title. When flash memory becomes less expensive for cartridge inclusion and sale, a greater profit can be made by programming large numbers of cartridges on demand and selling them to customers. If flash memory prices are relatively high, a sell-through is most feasible by first selling an empty cartridge to a customer, then programming it with the desired game content for an additional fee. After a period of time the customer may tire of the game and desire a new game. In such a case the cartridge is brought back and a new game is purchased but without purchasing a new blank cartridge. This then saves the hardware cost when a customer purchases a new game.

Certain novelties and advantages that the game programming system provides include on-demand swift programming of specially designed cartridges, satisfying consumer needs, programming only those cartridges verified as of proprietary design, programming many types and densities of cartridges, provision for retailers stocking only blank cartridges and never running out of any game title, down loading new game content from remote control server sites to enable immediate distribvution of new game titles to retail locations, remote programming of cartridges, where a game programmer box can be many feet from the PC, controlling multiple game programmer boxes by a single PC to save cost and providing a new tool to the store manager to perform analysis of the game business, including identifying popular games, monitoring daily transactions and days of rental and providing inventory analysis (listing cartridges by type and/or density).

BRIEF DESCRIPTION OF THE DRAWING(S)

Other objects and advantages of the invention will be apparent from the following description taken in connection with the accompanying drawings wherein:

FIG. 7 is a block diagram for the software driver design of the hardware FIFO, sequencer and cartridge;

FIG. 10 is a logic flow diagram of the game writing process;

FIG. 11 is a logic flow diagram of the game erase process;

DESCRIPTION OF THE ILLUSTRATIVE EMBODIMENT(S)

Figure 1:
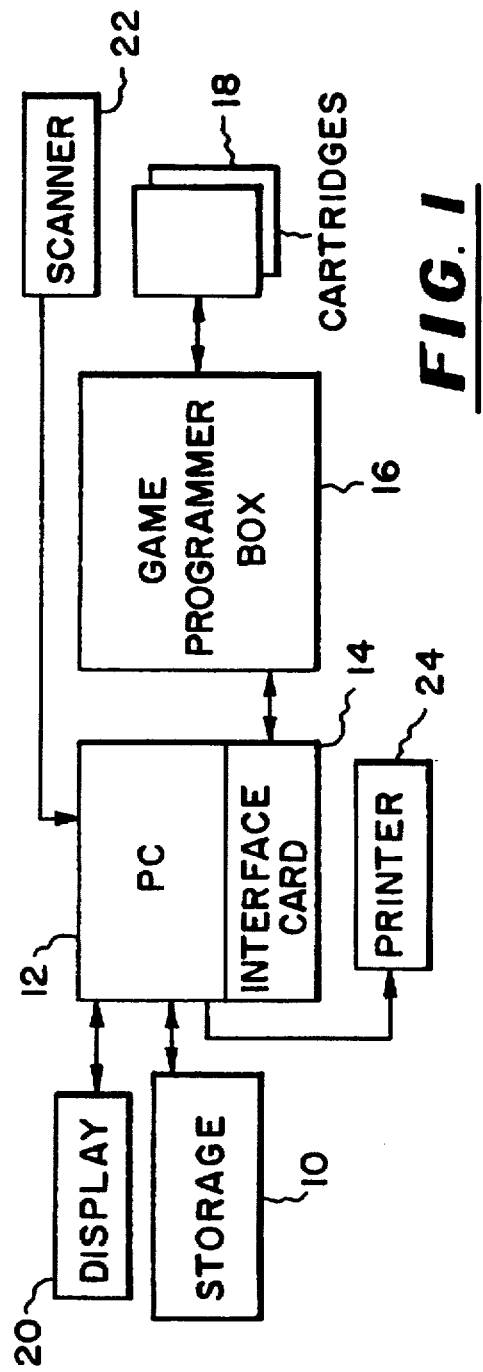
FIG. 1 is a block diagram of a game programming system in accordance with the principles of the present invention.

The game programming system of FIG. 1 comprises a storage subsystem 10, a personal computer (PC) 12, such as an IBM™ PSNaluePoint™ Mod. No. 6384L00 with 527 MB hard drive equipped with a game programmer interface card 14 that is attached to an external game programmer 16. The innovative concept is integral to the game programmer interface card 14, the game programmer 16, and the programming of a reprogrammable game cartridge 18.

The game interface card 14 provides communication and data transfer between the personal computer 12 and the game programmer 16. The interface card 14 communicates with PC 12 on a 16 bit bus. The interface card 14, as seen in greater detail in FIG. 4, contains an address buffer 56, data buffer 58, controls 60, FIFO (first in, first out) memory 62 and a sequencer 64. In a read operation, the game interface card 14 obtains information from the reprogrammable game cartridge 18 plugged into the game programmer at connector 40. The information is passed through the game programmer 16 and then directly on to the PC 12. The PC 12 uses this information to determine the cartridge type and whether it is of a predetermined type, configuration and quality for use by the programming system.

Figure 3:
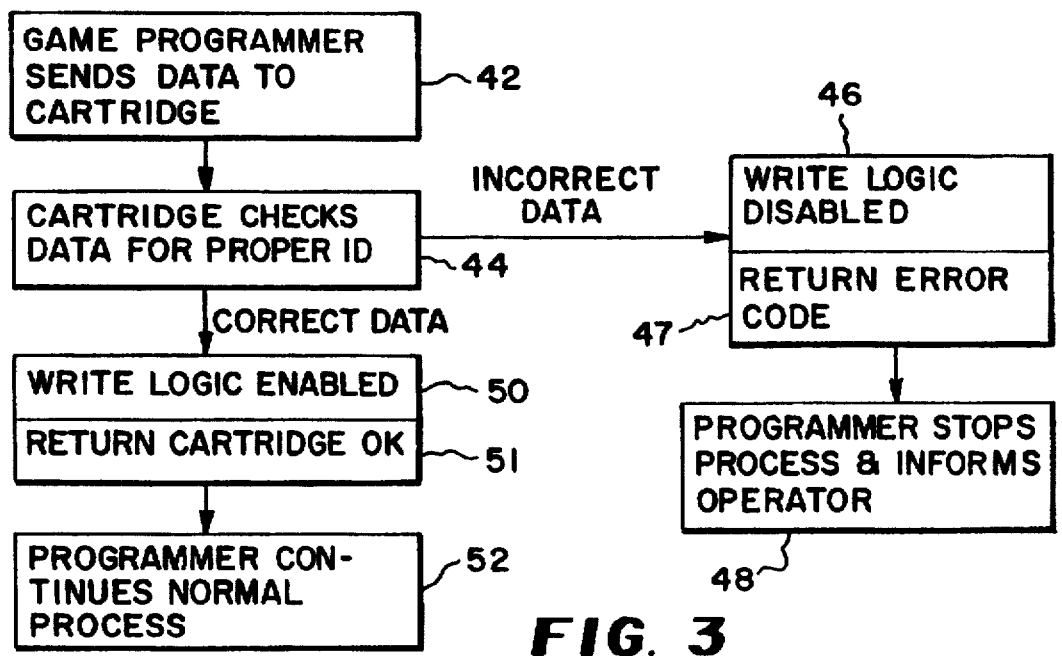
FIG. 3 is a logic flow diagram for the cartridge and game programmer, as illustrated in FIG. 1.

To provide a unique check for proprietary and quality designed game cartridges, a programmable array logic (PAL) or a generic array logic (GAL) 38 is programmed to enable the flash memory 30 and 32 of the cartridge 18 for writing, if and only if the "correct" data stream is sent from the game programmer 16 to the game cartridge 18, as best seen in FIG. 3. The PAL 38 will also send back a "cartridge verified" signal to the game programmer 16. This arrangement accomplishes two goals, a) the game programmer 16 will program only proprietary cartridges and b) other game programmers cannot program proprietary cartridges unless they know the unique data stream that must be provided.

As seen in FIG. 3, at step 42 the game programmer 16 sends identification data to the cartridge 18. At the cartridge 18, the data is checked as seen at step 44. If incorrect data is present, an incorrect data signal is sent to the write logic of the sequencer 64 which is disabled at step 46 and a return error code is sent to the game programmer 16 at step 49 which provides for the programmer 16 to stop the process at step 48. If the cartridge identification data is verified, then the write logic is enabled at step 50, a return cartridge OK code is sent to the game programmer 16 at step 51, and the game programmer 16 continues the process through step 52.

Figure 2:
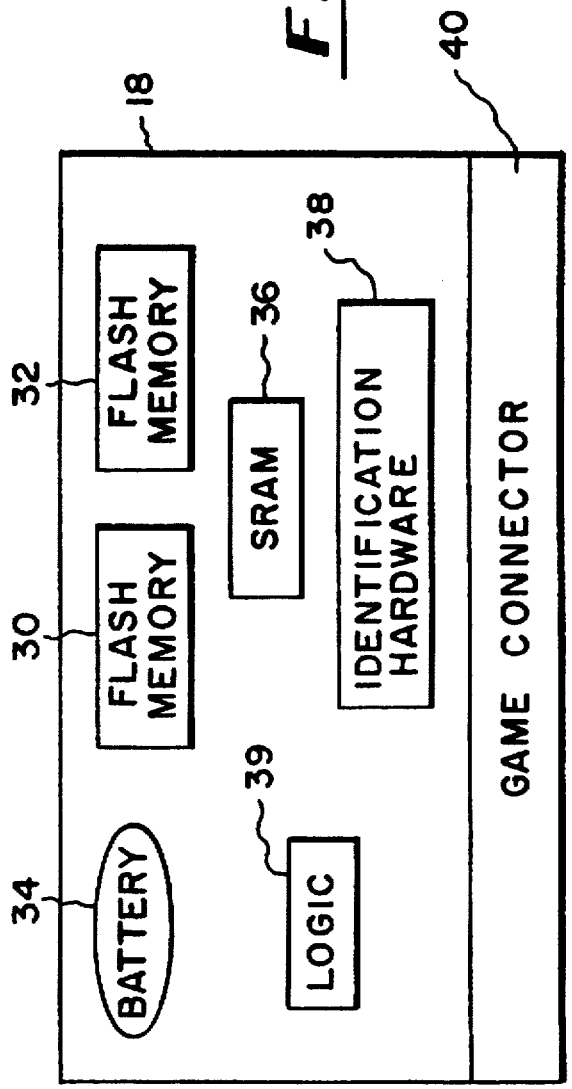
FIG. 2 is a block diagram of the reprogrammable cartridge, as illustrated in FIG. 1.

As further illustrated, in FIG. 2 the reprogrammable game cartridge 18 includes one or more flash memory chips 30 and 32. The illustrated embodiment of the cartridge design with flash memory 30 and/or 32 can be programmed in less than 30 seconds.

The flash memory 30 and 32 also holds retailer usable information such as store identification and cartridge type. The store manager or user application can input this information at cartridge initialization. A battery 34 providing backup for a static RAM (SRAM) 36 are optional and dependent on the requirement of a specific game. Typically, the battery 34 and SRAM 36 are used to hold player scores and other like tally results. The cartridge 18 contains unique identification hardware 38 such as the PAL that identifies it to a particular manufacturer, authorized distributor or retailer. Logic 39 functions to select between the flash memory 30 and 32 and the SRAM 36.

During a cartridge write operation, the game programmer interface card 14 accepts data from the PC 12 and fills the FIFO memory 62 in the interface card 14. The sequencer 64 in the card 14 generates addresses, proper commands, control and timing signals, and sends the game content from the FIFO memory 62 to the game programmer 16 which in turn passes the information to the reprogrammable game cartridge 18. It is the sequencer 64 in the interface card 14 that enables this game programming system to write data to the reprogrammable game cartridge 18 very rapidly.

Figure 5:
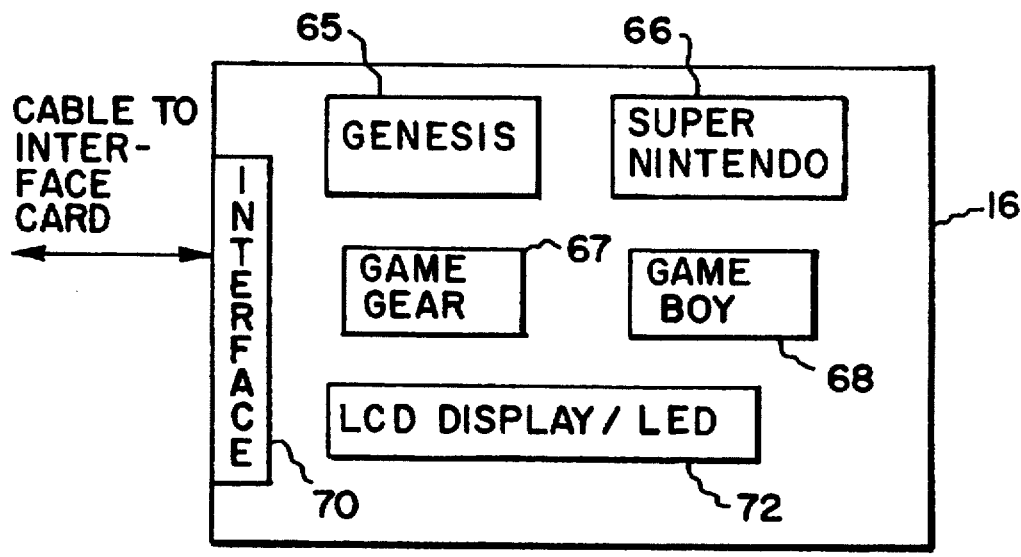
FIG. 5 is a block diagram of the game programmer, as illustrated in FIG. 1.

The game programmer 16 provides an interface between the game programmer interface card 14 and reprogrammable game cartridge 18. This programmer 16, as seen in more detail in FIG. 5, comprises electronic hardware and physical interfaces 70, including cables. The programmer is adapted to accommodate the plug-in of a number of reprogrammable game cartridges 18 at slots 65, 66, 67 and 68. Cartridges from different manufacturers and game formats have different densities and form factors. For example, a Sega Genesis™ cartridge will not fit into a slot made for a Nintendo SNES™ (Super Nintendo Entertainment System). Moreover, each type of cartridge has different electrical connections. Therefore, four separate slots 65, 66, 67 and 68 are provided in the game programmer 16 or an interposed cartridge adapter is included to accommodate, for example, multiple game formats. Those could include (a) Sega Genesis 65, (b) Nintendo SNES 67, (c) Sega Game Gear™ 67, and (d) Nintendo Game Boy™ 68. More slots can be added to accommodate other formats. Density denotes how much a memory chip or cartridge can hold. Higher density means that more bits are available for use by the video game.

The game programming system provides on demand programming of rewritable flash memory game cartridges for the rental and retail business. Flash memory semiconductor technology was introduced by Intel Corporation in 1988. At the semiconductor technology level Intel's ETOX™ (EPROM tunnel oxide) flash memory is based upon a single transistor EPROM cell. This technology provides high-density, truly nonvolatile and high performance read-write memory solution. The main characteristics of this memory are low power consumption, extreme ruggedness, and high reliability. Low power consumption is particularly evident when compared to other erasable PROM technologies, such as EEPROM and EPROM.

Flash memory technology utilizes a one-transistor cell, providing increased densities, scalability, higher reliability and lower cost, while taking advantage of in-system mass electrical erasability. Moreover, flash memory offers distinct advantages when compared to other solid state memory technologies. For example, in comparison with electrically erasable programmable read-only memory (EEPROM), EEPROM, while being non-volatile is also electrically byte-erasable. This requires a more complex cell structure, resulting in significant different features and capabilities including a limited capacity vs density, lower reliability and higher cost. These make it unsuitable as a mainstream memory. Thus the cell structure of an EEPROM is more complex, (i.e. contains more parts/data-stored) than does flash memory. Moreover, when programming EEPROM, it takes about 10 ms (milli-seconds) to write to each location or cell. When programming flash memory, it takes only 9 μs (micro-seconds) to program each location. In the illustrated instance, with flash memory 30 and 32 (each 8 bits wide, and when addressed, done in parallel for 16 bits), two megabytes may be programmed in less than 10 seconds. This is approximately three orders of magnitude faster than EEPROM.

In an embodiment of the present system, two 8 megabit flash memory chips (Intel™ 28F008SA) are used. This gives 2 megabytes of storage in a single cartridge. Note that the game programmer 16 can handle up to 16 megabytes and should satisfy most memory requirements for game cartridges. The game programmer 16 can also be redesigned without difficulty to accommodate memory cartridges with higher density should that need arise. Time for manufacturing a cartridge has been drastically reduced to less than 30 seconds so that a customer may wait for the product while it is being manufactured without feeling unduly delayed.

Figure 4:
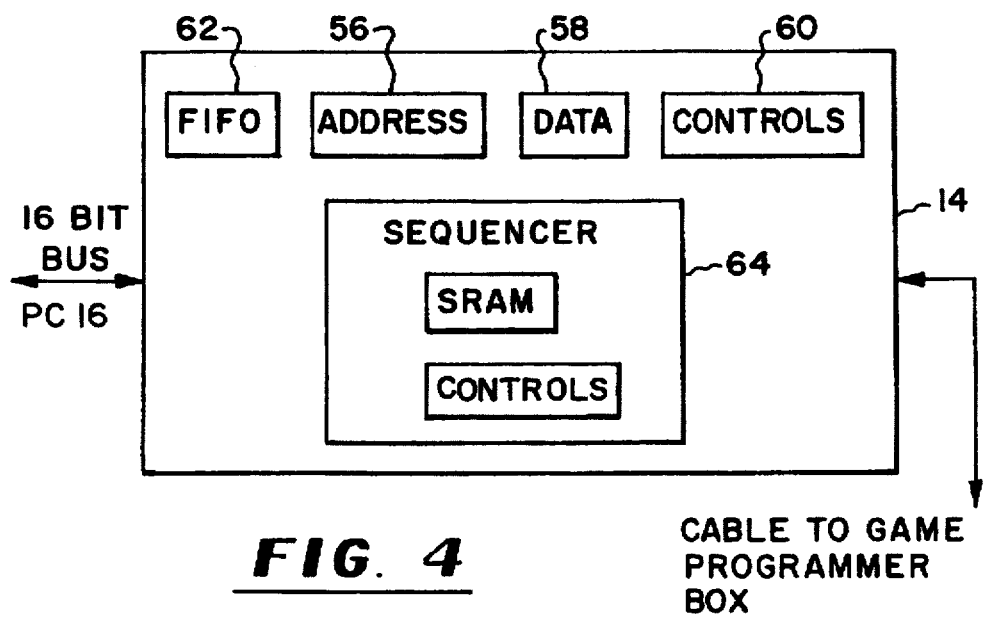
FIG. 4 is a block diagram of the game programmer interface card, as illustrated in FIG. 1.
Figure 6:
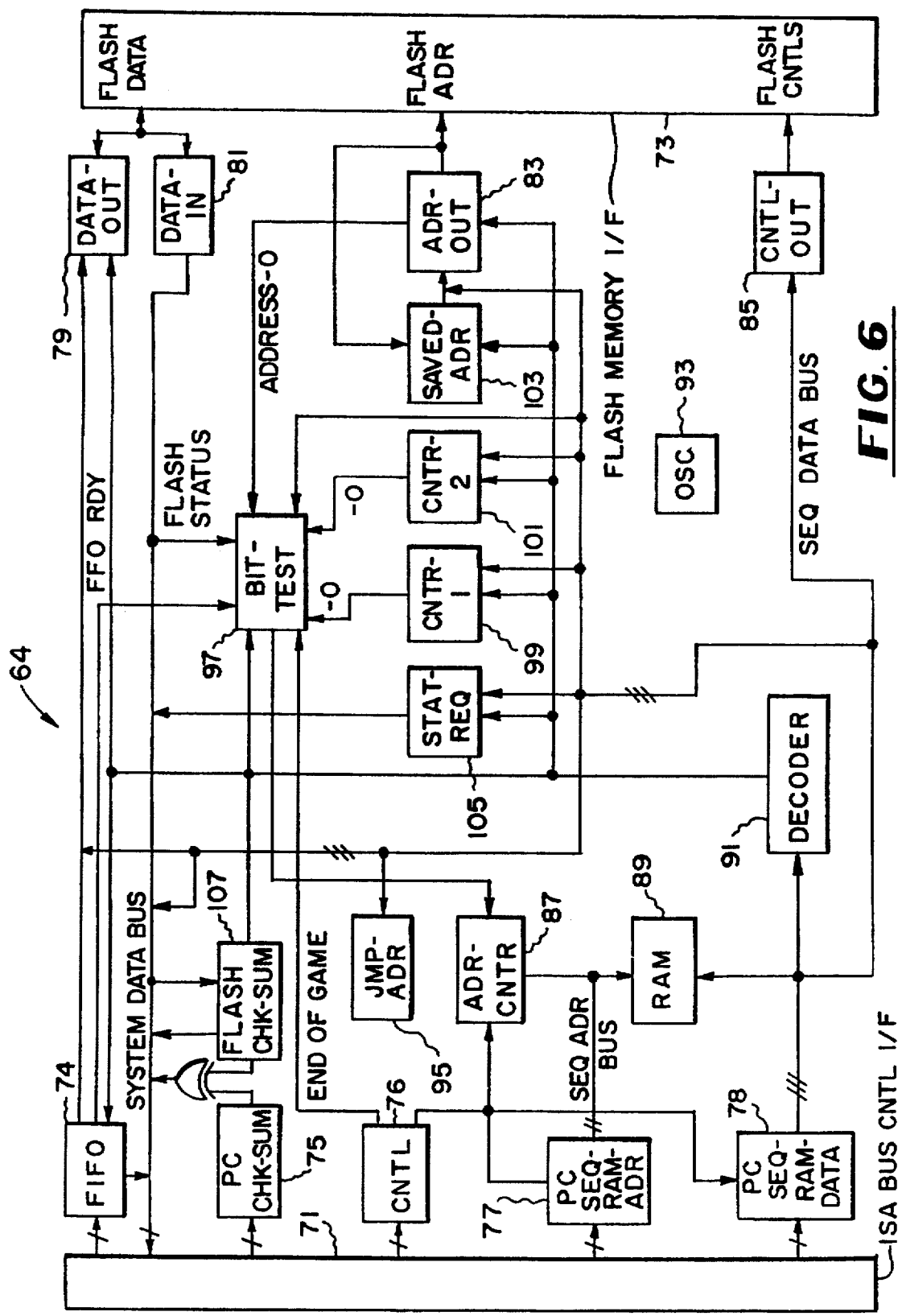
FIG. 6 is a block diagram for the game sequencer as illustrated in FIG. 4.

The sequencer (SEQ) 64 of the game interface card 14 is best illustrated in FIG. 6. The ISA I/F or ISA bus interface includes the ISA BUS CONTROL I/F 71 and provides control logic to the interface between the ISA bus and SEQ 64. FLASH MEM I/F 73 provides the flash memory I/O signals. FIFO 74, or as shown in FIG. 4 as FIFO 62, is used by the ISA bus to load game data while the SEQ 64 is carrying out the programming of the flash 30 and 32. The SEQ 64 off-loads the data one by one or in a parcelling manner when the FIFO 74 is not empty. PC CHKSUM 75, which is hereinafter further explained, holds game checksum which was calculated and loaded by software (SW) on the PC. CNTL 76 is used by the PC SW to signal SEQ 64 to start the programming process and to let SEQ 64 know when the End-Of-Game occurs and is sent forth on the internal control line. PC SEQ-RAM-ADR 77 is used by PC SW to address the SEQ 64 RAM 89 locations. PC SEQ-RAM-DAT 78 is used by PC SW to write data to the SEQ 64 RAM locations.

The SEQ I/F includes the DATA-OUT 79 which functions to place FIFO-data from FIFO 74 to place a command on Flash Memory I/F data bus 73. DATA-IN 81 is used by the SEQ 64 to receive data or status from Flash Memory I/F data bus 73. ADR-OUT 83 functions to allow the SEQ 64 to generate address to access flash memory 30 and 32. CNTL-OUT 85 is used by the SEQ 64 to generate control signals to flash memory 30 and 32.

The sequence engine includes ADR-CNTR 87 which accesses the internal code of SEQ 64 internal code which is stored in RAM 89 and which functions as the code address counter. The RAM 89, as stated, holds the SEQ 64 internal code. This code is loaded by the PC SW after power-on-reset (POR). It is also read back and verified by the PC SW to ensure that the content was loaded correctly. The DECODER 91 of FIG. 6 decodes the SEQ engine code and generates the appropriate control signals to other registers. An OSC 93 is an oscillator which generates clock for the entire SEQ engine. JMP-ADR 95 acts to hold the jump-address of the code location. If the BIT-TEST 97 is true, its content is loaded into the ADR-CNTR 87. The BIT-TEST 97 is used by the SEQ 64 to test various hardware (HW) status and to determine branch conditions for the SEQ internal code. CNTR-1 99 is used by the SEQ 64 as a general purpose counter and functions as, e.g., a timer, byte count, loop count and delay. CNTR-2 101 is similarly used by the SEQ 64 as a general purpose counter and functions also as a timer, byte count, loop count and delay. A SAVED-ADR 103 is used by SEQ 64 to save the current flash address for later use. While STAT-REG 105 is used by the SEQ 64 to send status to the PC SW, the FLASH CHK-SUM 107 is used by the SEQ 64 to do HW game checksum calculation and compare it with PC CHK-SUM 75.

The BUSES of the sequencer (64), as illustrated in FIG. 6, include the SYSTEM DATA BUS marked with a single hash mark across the bus line. This system data bus is accessible by the PC SW. As an input to the PC SW, it is multiplexed from Flash-Data-Bus and SEQ-Status-bus. As an output from the PC SW, it is the ISA Data-Bus. The SEQ ADR BUS is marked with a double hash mark. This is the SEQ RAM Address bus, which accesses the SEQ engine code in RAM 89. The SEQ DATA BUS is marked with triple hash marks. This SEQ data bus has Ob-code-field, Data-field and Control-field. The Ob-Code-field is sent to the decoder 91 as instruction. The Data-field is sent to the registers, including 99, 101 and 105, as an example, as data. The Control-field is sent directly to the flash 30 and 32 as control signals. The Control-field is independent from other fields that is, it can change without affecting other fields' operations. The Ob-code-field normally operates with Data-field. It is also possible to operate without Data-field, i.e., the SAVED-ADR 103 or FIFO 74 can operate without Data-field. Data-field does not work by itself. Registers that can execute in one instruction are FLASH CHK-SUM 107, SAVED-ADR 103, ADR-OUT 83 which can to an increment, DATA-IN 81 which can do a low byte select and CNTR-1 99 and CNTR-2 101 which can do a decrement or increment.

The software interface provides for adapter communication being executed through Port I/O using a single port for all read, write, erase, LCD 72, LED, and status operations. Write operations use the on-board sequencer 64 and FIFO 62 hardware to write data to the flash memory cartridge 18. Since the size of the hardware FIFO 62 is 2 KB, all write requests are executed using 1 KB blocks, using a flip-flop method for increased performance. Once the data reaches the FIFO 62, the on-board sequencer 64 reads the FIFO 62 and transfers the data to the flash memory cartridge 18. During the write operation the hardware will accumulate a simple 8-bit checksum. When the write operations are completed, the checksum is compared to a software checksum to verify the write operation. In addition, during the write operation the device driver will be checking a write status signal after each data transfer for run-time errors. Write LCD/LED operations are executed using Port I/O on the interface card 14.

Read operations read data directly from the flash memory chips 30 and 32 via the I/O Port and erase operations use the "Flash-Specific" block erase command. The erase commands are unique to each type of flash memory chip.

Software operations using multiple interface cards 14 in a single PC 12 can be synchronous or asynchronous depending on the operating system platform. Software operations on a single interface card 14 attached to game programmer 16 with multiple game cartridges 18 slots 65, 66, 67 and 68 are synchronous. Therefore multiple operation requests to a single interface card 14 are blocked or serialized by software semaphores in a device driver rather than a more complex hardware design. For the hardware microcode driver design, the sequencer 64 on the PC interface card 14 requires a downloadable set of microcode to accommodate data transfer operations between the FIFO 62 and the flash memory 30 and 32. This is the microcode that will control the various game cartridge formats of the game programmer 16 supported by the game manufacturing system. This microcode is downloaded by the game system device driver 16 which also passes commands and data to the sequencer 64 via the card FIFO registers 62. The sequencer internal code controls the following functions: writing of data from the FIFO registers 62 to the flash memory 30 and 32; calculation and comparison of data checksum to verify write operations; and reading of data from flash memory 30 and 32 to the FIFO registers 62.

The advantage of using a sequencer 64 in this application is that the sequencer code can be modified to suit different types of writable ROMs. The sequencer microcode is created much like standard assembly language wherein the steps include the first step of create a source code file using pre-defined opcodes and operands, and the second step of assemble source code file using GASM.EXE (game assembler).

The GASM.EXE command creates two output files from the original source code file. The first is similar to a standard assembler listing (filename.LST), and the second file is the binary sequencer microcode (BSM) file and assumes the BIN extension. One BSM file will exist for each game cartridge type, and all appropriate BSM files will be downloaded to the PC interface card 14 during the device driver initialization process.

The hardware and software component definition and installation is set forth as follows and is further explained with regard to FIG. 7:

| Module | Description | Location |
|---|---|---|
| FLRSYS.LIB | Export library for 32-bit Flash Memory System API's | LIB |
| FLRSYS.DLL | Dynamic Link Library for 32-bit Flash Memory System API's | LIBPATH |
| FLRIOPL.LIB IOPL | (Ring 2, 16-bit) Flash Adapter Driver LIB | |
| FLRIOPL.DLL | IOPL (Ring-2, 16-bit) Flash Adapter Driver Dynamic Link Library | LIBPATH |
| FLRSYS.H | Flash API, error code, and constant definitions | INCLUDE |
| CFG.DLL | Flash Memory System Support API's | LIBPATH |
| FLRSYS.INI | Flash Driver initialization file (used by FLRSYS.DLL) w/FLRSYS.DLL | |

The LIBPATH variable for the modules FLRSYS.DLL, FLRIOPL.DLL and CFG.DLL, respectively blocks 114,116 and 118 in FIG. 7, is defined in OS/2™ 2.x Config.Sys File.

The software driver design employs a strategy, as illustrated in FIG. 7, using a Ring-3 32-bit dynamic link library (FLRSYS.DLL) 114 as the software link between the user interface application 112, comprising, for example, the LCD display 72 or a keyboard, and the flash memory driver (FLRIOPL.DLL) 116. The FLRIOPL.DLL is a Ring-2 16-bit IOPL (input/output privilege level) driver that communicates with the PC interface card 14 using Port I/O, as shown in FIG. 7.

Figure 8:
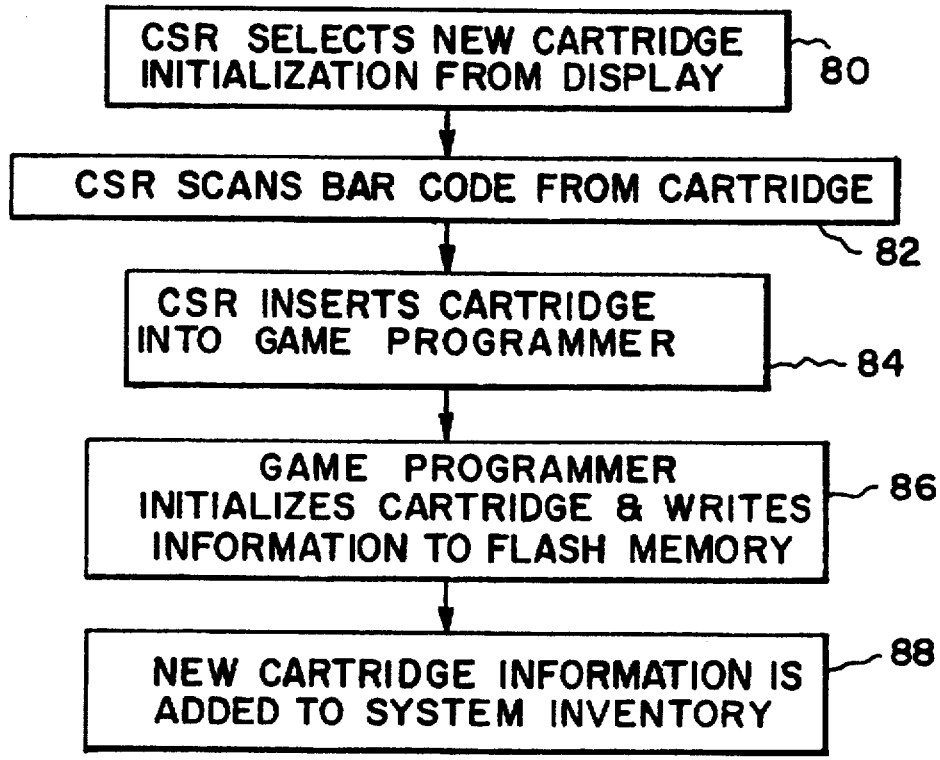
FIG. 8 is a logic flow diagram of an initialization process for the reprogrammable cartridge, as illustrated in FIG. 1.

The following scenarios explain how the game programming system of FIG. 1 is used. A new cartridge initialization procedure, as illustrated and further described in FIG. 8, includes the steps of a customer service representative (CSR) selecting new cartridge initialization from the display 20 at step 80. The CSR uses the scanner 22 to scan bar code from the cartridge 18 at step 82. Generally, new unprogrammed cartridges will have bar code indicia on them with the following category information: (1) the store I.D.; (2) kind of cartridge, i.e. Sega, Nintendo, etc. and (3) a cartridge serial number. This information is programmed into a portion of the cartridge flash memory 30 and 32 by the initialization technique (either bar code or computer keyboard etc.). This would normally be done by the business operation in advance of the need for the cartridges. The cartridges are then put into their appropriate bins awaiting usage (i.e. a customer orders a game). Game cartridges that are going to be reused could also be placed in the same bins, because the category numbers associated with the cartridge would already be placed in the cartridge. Other information that would or could be placed in this section of the memory would be the game identification. This would occur when the CSR instructs the manufacturing machine to download a specific game. The CSR inserts the cartridge 18 into the appropriate slot in the game programmer (GP) 16 for engagement of the cartridge game connector 40 at step 84. As previously provided for at step 44 of FIG. 3 the cartridge 18 identification check is made. The GP then initializes the cartridge 18 and writes bar code information into the cartridge flash memory 30 and 32 at step 86 thereby automatically adding new cartridge information to the system's inventory in storage 10 at step 88.

Figure 9:
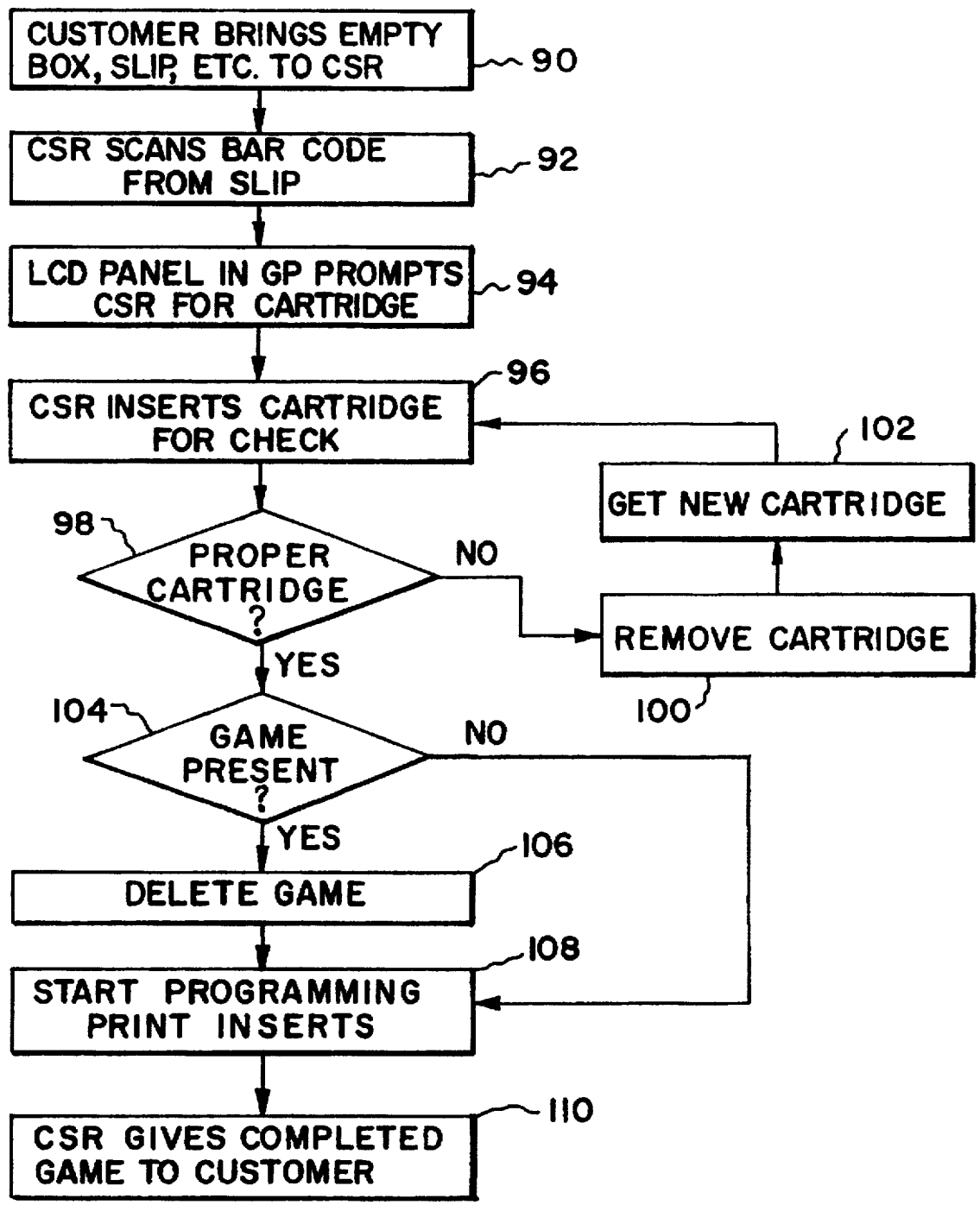
FIG. 9 is a logic flow diagram of an on-demand manufacturing process of the reprogrammable cartridge, as illustrated in FIG. 1.

The on demand game manufacturing, as illustrated and further described in FIG. 9, includes the steps of a customer bringing game placard, empty Amaray box, or slip to a CSR at step 90. The CSR initiates the manufacturing process by scanning the bar code, for example, from the empty box or slip at step 92. The LCD panel 72 in the GP prompts the CSR for an appropriate cartridge 18 at step 94. The game programming system checks for a proper cartridge (design, type, and density) at step 96. Once the steps of obtaining and identifying a proper cartridge through steps 98, 100, 102, 96 and back to 98 are completed, the LCD panel 72, as an example or optionally, prompts the CSR to erase the cartridge 16 at steps 104 and 106 if a game is present. If none is present, step 108 provides for the system to begin writing the game cartridge and sends information to the printer 24. The printer 24 produces identification and instructional inserts for the game. Once assembled and completed, i.e., at step 110, the customer's order is satisfied and the transaction is completed.

As hereinbefore stated the game programming system can be modified to program other types of data cartridges. Further, the system is not limited to programming game cartridges.

In a retail store setting a customer reviews and selects a game for manufacture at a game kiosk. The game kiosk may comprise a monitor with preferably a touch screen graphical user interface, although a keyboard serves as a reasonable alternative. The user selects or identifies, in order, (1) the type system the customer has, or chooses to browse games available for purchase or rental; e.g. Sega, Nintendo etc., (2) then selects a category of those games available., i.e. sports, combat, children's etc. and (3) then proceeds to browse the titles and view a short clip showing the characters involved and/or a brief description of the game, including the graphics associated with the games' front cover.

Once the customer has made a decision to select a particular game or games, those selections are made on the touch screen and an order slip is printed out. A slip printer is included a part of the kiosk. The slip is given to the customer service representative (CSR) at the front or retail check-out desk where a point-of-sale register or terminal is located. The printed slip may contain a printed game title and/or a bar code. The bar code contains at least the necessary information concerning the selected game; i.e. the game identifier (ID) or part number. The CSR then processes the slip with the bar code part number at a game storage computer and the slip is scanned, such as by a bar code scanner, into the game storage computer to give the necessary initiating indicia for identification of the game and for the game to be manufactured. Concurrently, an appropriate cartridge is placed into the game programmer 16 ("ROM burner") which reads any information contained in the cartridge. If, for example, the cartridge had been previously rented and contains another game in flash memory plus other cartridge and source information, steps 96, 98, 100 and 102 of FIG. 9 are invoked. In that event, a portion of the flash memory includes complete inventory information, and means that the cartridge flash memory must be erased before being reloaded, as hereinafter explained with regard to FIG. 11.

The steps for writing, whether it be a game or other program, are more fully described with reference to FIG. 10. Optionally, the content to be written may be encrypted and/or compressed as a file. This is more fully discussed with regard to FIGS. 12–14. In step 120 the application 112 opens a file with content from the storage 10 which is intended for the flash memory 30 and 32. The application 112 then, in step 122, passes the pointer to the file contents to the device driver API as set forth in FIG. 7. Step 124 provides for the device driver API to break the contents for the flash memory 30 and 32 into 1 Kbyte blocks and passes each block individually to the device driver. As earlier explained in FIG. 7, step 126 provides for the device driver to write the data to FIFO 62. The sequencer 64 reads the data, in step 128, from FIFO 62. The data is then written by the sequencer 64 to the flash memory 30 and 32 in step 130 which includes a time monitoring function described hereinafter. The checksum operation previously discussed with regard to FIG. 6, is then carried out by the sequencer 64 to verify the status of the write operation in step 132. The sequencer 64, at this point or step 134, returns the results to the device driver. However, if more than one 1 kbyte block needs to be processed, then steps 126–134 are repeated until all blocks are processed.

The game erase process, as hereinbefore discussed with regard to FIG. 9, and in particular steps 104 and 106, is now more fully described with regard to FIG. 11. The erase process is dependent on the flash memory parameters present, but in general requires the application 112 to pass the erase command to the device driver API, as covered by FIG. 7, and as set forth in step 136 of FIG. 11. That command is passed through by the device driver API to the device driver in step 138. At step 140, the device driver acts to erase the flash memory 30 and 32 with 16 separate block erases as was hereinbefore presented. This is dependent on the selected flash memory. Assuming, however, that the flash memory in the cartridge is empty, a pre-activity to the game burning activity is the placement of the bar code on a paste-on strip or the like, and the placement in the cartridge of additional information. This includes another slip with bar code and in a small area of the flash RAM, the following information: (1) the store identifier, (2) the cartridge serial number, (3) the "kind" of cartridge it is, i.e. Sega, Nintendo, etc. and (4) the game part number, is incorporated. During cartridge programming this same information is also placed and is included on the instruction sheet both of which are packaged by the CSR. Also, the information is sent to the local store computer, or point of sale computer (i.e. an IBM Mod. 90 computer) which captures all of the information concerning the game to be replicated. This information, in addition to information on check-in/check-out status for rental cartridges is considered transactional information.

In certain retail establishments (e.g. Blockbuster Video stores) the transactional information is transmitted, for example, once per day, or at other convenient intervals and times to the computer at, for example, headquarters of the retail operation. The point-of-sale computer audits the transmission back to the game computer to determine if there is any missing or incorrect information. As, for example, if the store number is incorrect, the point-of-sale computer will send an error code indicating that another cartridge should be placed in the game programmer 16. This would also be true if the cartridge contained, for example, an invalid cartridge serial number.

The CSR also, at the point-of-sale register or monitor, further processes the package instruction and programmed game cartridge. There the cartridge rental information, i.e., the part number, and various identification numbers plus any additional information, e.g., the customer's name, address, may be stored and printed out on a receipt, including rental/sale price, and may also be sent to the local store computer and matched with the information concerning the cartridge I.D. and part number already received by the local store computer.

As is easily recognized from the foregoing description, there is no requirement that the POS register or terminal be directly connected to the game storage computer. However, that is possible and even may be advantageous depending upon the particular store arrangement in order to enhance and automate the commencement of the game-loading and cartridge programming activity.

The game computer has stored therein, for example, in hard-drives, CD ROMS, tape or other local storage media, the game content for all of the games may be produced. A protection system for the file content are discussed hereinafter with regard to file security. After the game-to-be-produced information or indicia is provided to the game storage computer, and a new or used cartridge is installed, the sequence of loading the game and additional identifying information into the flash memory 30 and 32 is commenced.

Also further connected to the separate or game storage computer, by for example a telephone line, is a host game computer which serves to update the directory of the game computer and run remote diagnostics if necessary. The host computer also functions to download to and store new or modified games for later transmission to the game storage computer and also provides for the transmission of other data.

In the game manufacturing system of FIG. 10, the step 130 includes a timer is operating and counting down whenever the game burning application is operational. In addition, a time counter provides for either a preset time and duration or for a predetermined time period for completing, in addition to burning, connect time. Periodically, a connection between the game storage computer and the host computer which could be remotely located is attempted, as, for example, by a modem, satellite or direct line. The system functions in a manner that if a timely connection is not made or is terminated prematurely between the host and the game storage computers, the game burner application time counter, that is always running, will not be reset by the other necessary and regularly transmitted data, such as the accounting data, and the system will only operate for the period of time remaining in the counter and then will cease to function. If the broken connection is not caused by the operator, whether accidentally or otherwise, the operator can request from the host computer a back up password, which will provide a grace period or pardon to enable a temporary and usually short, but extra, time period of selected duration for normal operation of the game burning application. This provides some reasonable time between connections, but will not permit the game burner application to run without first transmitting sufficient support data to and from the host computer within set scheduled time periods or before prolonged periods of time have elapsed.

Accounting for business activities when the game computer connection to the host is made must be done in a timely manner to maintain accountability and to be in accordance with accepted accounting practices. The game burning application will not operate after the two selected periods of time have passed. However, it will reset to normal operation if the connection is resumed and all other data, including support data, is transmitted between the game storage computer and the host system.

Figure 12:
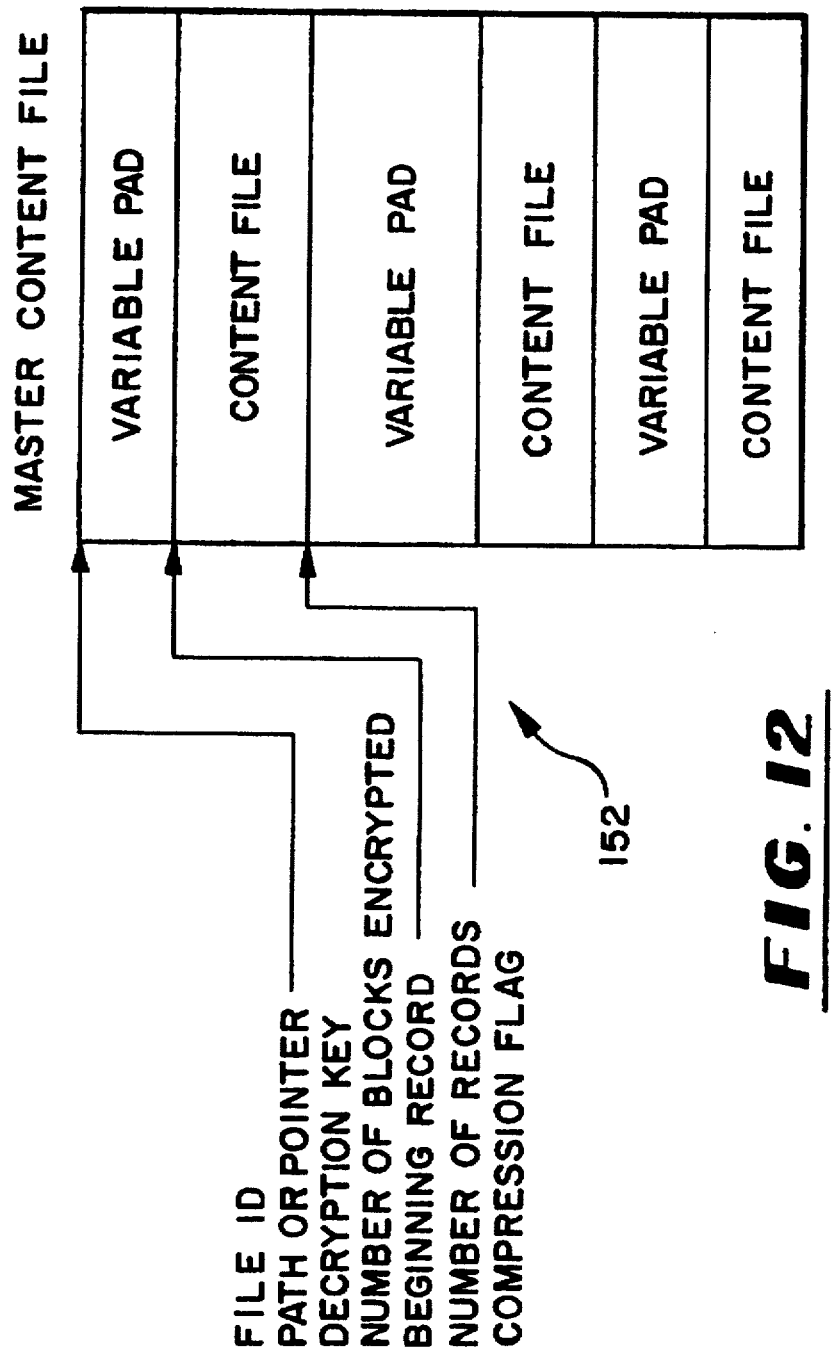
FIG. 12 is a schematic block diagram of a Master Content File for encryption.
Figure 13:
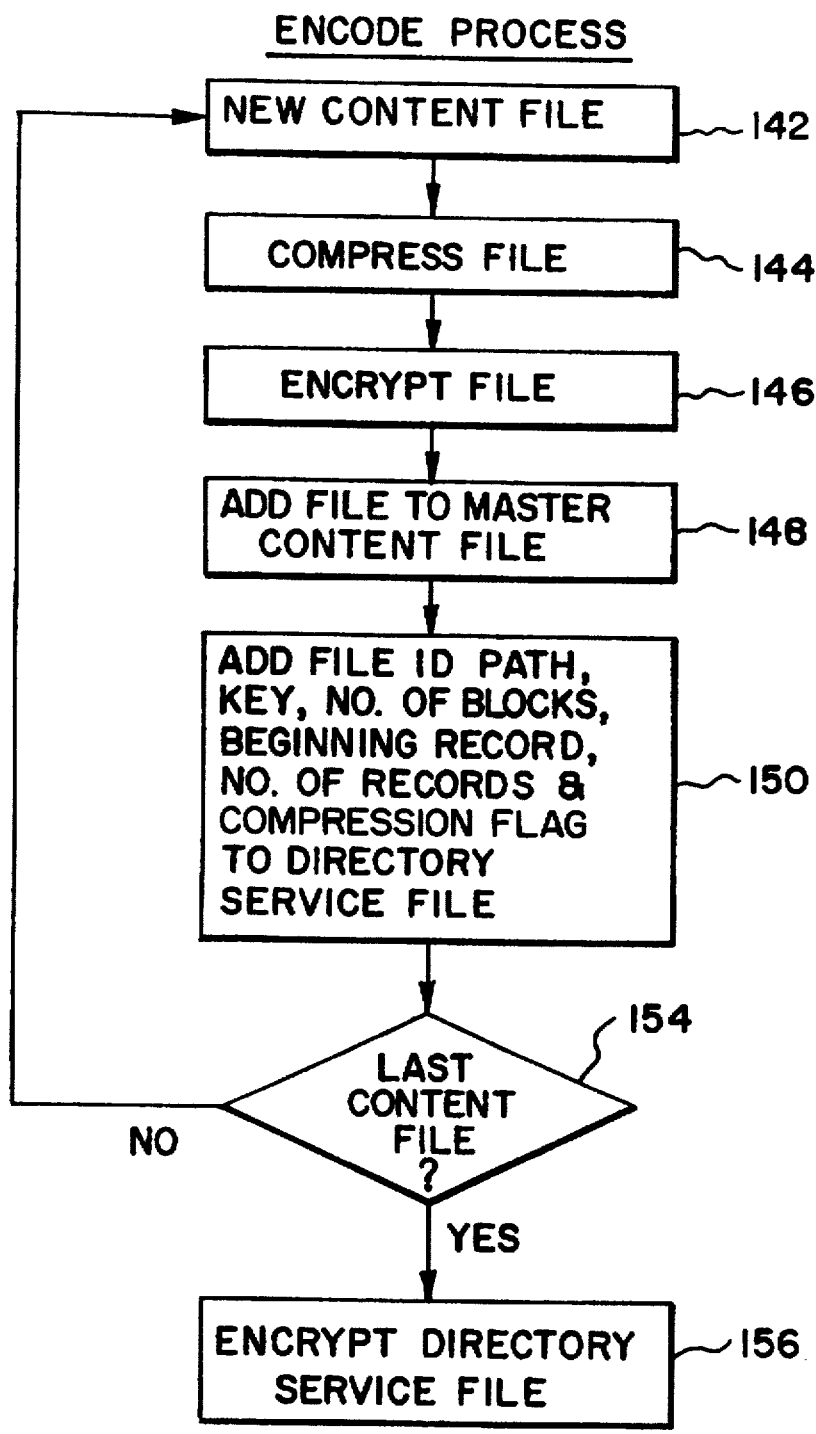
FIG. 13 is a logic flow diagram for encryption of a Content File.
Figure 14:
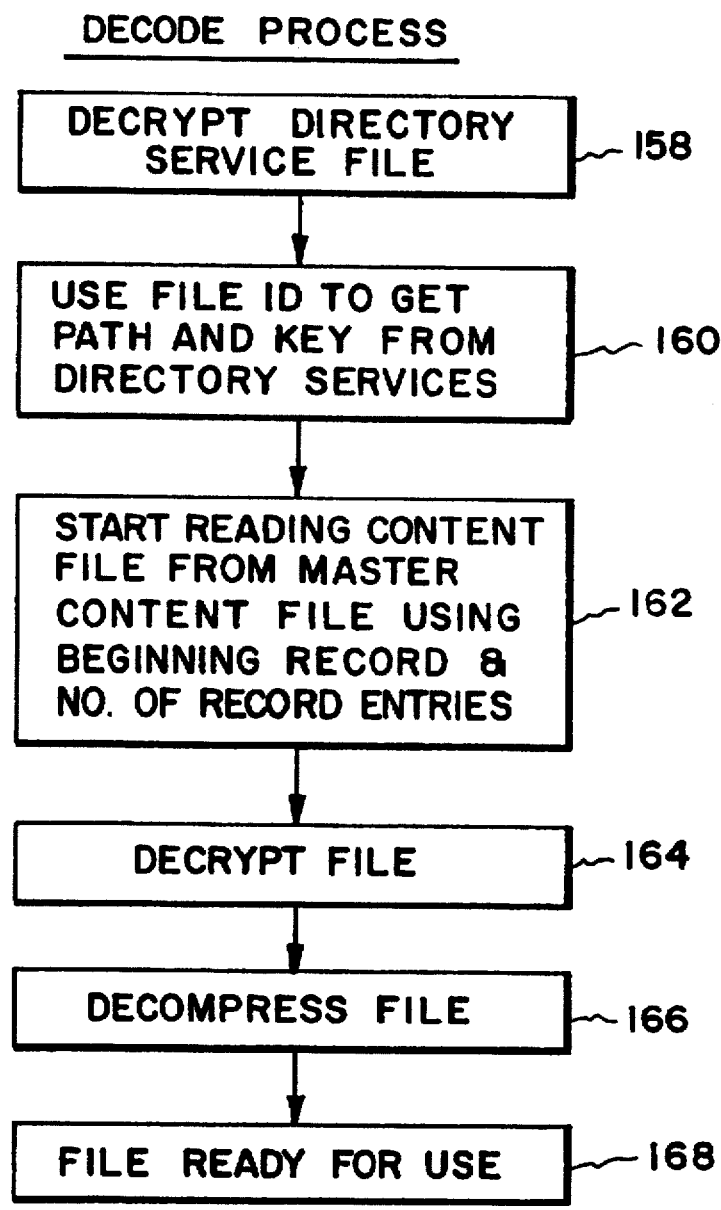
FIG. 14 is a logic flow diagram for decryption of a Content File.

Presented in FIGS. 12-14 is a security process with variations for protecting a computer file from unauthorized access or reading. A number of levels are incorporated to conceal the data and its location on a storage medium. The process incorporates an encrypted directory service file which contains pointers to the actual video game content file and a key for decrypting the content file. The content files are encrypted and can be compressed as well, which comprises and optional step in the process. This method is also applicable regardless of the storage medium employed such as CD-ROM, hard disk or via network connection. The video game content files are processed as set forth in FIG. 13. FIG. 13 provides initially for creating a content file base and a Directory Service file by identifying at step 142 a new content file. An optional step 144 provides for compressing the content file. This video compression is carried out following algorithms well known in the art. The next step 146 provides for encrypting the content file, using well known encryption methods. Step 148 provides for creating a master disk file of content file(s) or to copy the content file to storage medium. Thereafter, at step 150 a directory file entry for each content file is created and includes: file ID, pointer/path to content file, decryption key, number of blocks encrypted, beginning record, number of records and a compression flag.

This is illustrated in block form as a Master Content File 152 in FIG. 12. Once all content files are processed, as decided at step 154, the Directory file is encrypted at step 156.

Accessing and reading the content file is set forth in the steps of FIG. 14. Decryption of the Directory file transpires at step 158. At step 160 the Directory file is used to find the content file. It obviously follows that the content file in then read at step 162 in order to start decrypting the content file at step 164. If the option of compression was practiced at step 144, step 166 decompresses the content file presenting a file ready for use at step 168. The Directory Services file generated at step 150 of FIG. 13 can be encrypted through public key (asymmetric) or private key (symmetric) encryption. Content files are stored separately and can be encrypted via private key (symmetric) encryption. Private key or symmetric encryption means that the sender and receiver each know the key privately and the same key will be used for encryption and decryption. However, public key or asymmetric encryption adds a level of security. The public encryption key is publicly known e.g. by several people. A special software program is used by the intended recipient of the information. With the special program a public key is randomly generated along with a private key, which private key is created by and for one user, the recipient, and only the recipient will know that private key. The private key has a mathematical relationship with the randomly generated public key and each is a function of the other. The recipient uses the private key for decryption only. The sender receives the public key from the intended recipient, the person who is to receive the information, and the sender can enter the public key for encryption only.

This method adds an additional level of security by putting all content files inside of a master content file with variable and random pads for additional obfuscation of the content file's starting and ending points.

While the invention has been particularly shown and described with reference to a detailed description, it will be understood by those skilled in the art that various changes in form and detail may be made therein without departing from the spirit and scope of the invention.

© Copyright 1994 Fairway Technologies All Rights Reserved

TYPICAL OPERATION
FLASH WRITE OPERATION

PC software

| | |
|---|---|
| 1: | PC SW write to CNTL reg to activate SEQ-Code |
| 2: | Keep Load FIFO with Game content and monitor FI OF status to avoid FIFO overflow condition. |
| 3: | When at End of Game (EOG), write to CNTL to signal SEQ that EOG is reached. |
| 4: | Check for SEQ DONE status and other ERROR status if present. |
| 5: | End program and SEQ-Code. |

SEQ CODE

| | | |
|---|---|---|
| 1: | CNTL-OUT = inactive | |
| 2: | ADR-OUT = 0 | |
| 3: | DATA-IN = write command | |
| 4: | CNTL-OUT = write sequence | |
| 5: | JMP-ADR = 12 | |
| 6: | BIT-TEST, FIFO not empty ? | (jump to 12: if not empty) |
| 7: | JMP-ADR = 5 | |
| 8: | BIT-TEST, not E.O.G. ? | (jump to 5: if not E.O.G.) |
| 9: | STAT_REG = Report STATUS & DONE | |
| 10: | JMP-ADR = 11 | (End SEQ code) |
| 11: | BIT-TEST, always true | (jump to 11:, loop to itself forever) |
| 12: | DATA-OUT = FIFO | |
| 13: | CNTL-OUT = write sequence | |
| 14: | CNTL-OUT = Read sequence | |
| 15: | JMP-ADR = 16 | |
| 16: | BIT-TEST, Flash Status not ready | (jump to16: if Status |

-continued

© Copyright 1994 Fairway Technologies All Rights Reserved

| | | |
|---|---|---|
| 17: | ADR-OUT = increment | = not ready) |
| 18: | JMP-ADR = 3 | |
| 19: | BIT-TEST, always true | (jump to 3:) |

FLASH READ OPERATION

PC software

| | |
|---|---|
| 1: | PC SW read game content from PC storage and calculate check-sum |
| 2: | Write check-sum to PC CHKSUM |
| 3: | Write to CNTL to signal SEQ that check-sum was loaded and start read operation to compare check-sum |
| 4: | Check or SEQ DONE status, check status, and HW check-sum |
| 5: | End program and SEQ-Code |

SEQ CODE

| | | |
|---|---|---|
| 1: | CNTL-OUT inactive | |
| 2: | ADR-OUT = Game Ending address | |
| 3: | CNTL-OUT-Read sequence | |
| 4: | FLASH CHK-SUM = Calculate check-sum | |
| 5: | JMP-ADR = 10 | |
| 6: | BIT-TEST, ADR-OUT = 0 ? | (ADR-OUT = 0, game is read completely) |
| 7: | ADR-OUT = decrement | (Decrement address by 1) |
| 8: | JMP-ADR = 4 | |
| 9: | BIT-TEST, always true | (jump to 4:) |
| 10: | STAT_REG = Report STATUS & Done | |
| 11: | JMP-ADR = 12 | (End SEQ code) |
| 12: | BIT-TEST, always true | (jump to 12:, loop; to itself forever) |

What is claimed is:

1. A method controlled by a personal computer of manufacturing video game within a cartridge for insertion into a compatible video game machine for interactive play with a human, comprising the steps of:

selecting a video game for manufacture of selected video game content corresponding to the selected video game within a host game computer or a game storage computer;

identifying indicia for the selected video game;

transmitting the identifying indicia corresponding to the selected video game for manufacture of the selected video game content within the cartridge to the game storage computer storing data, including game content data corresponding to the selected video game;

transmitting to the personal computer transactional data, corresponding to an occurrence of the transmitting of the identifying indicia to the game storage computer;

downloading game content data corresponding to the identifying indicia of the selected video game from the game storage computer into memory within the cartridge; and interrupting downloading of the game content data from the storage computer prior to the content data of the selected video game being fully downloaded into the memory within the cartridge, upon the occurrence of a predetermined event as a function of a failure to transmit to the personal computer transactional data corresponding to the identifying indicia.

2. The method of manufacturing a video game within a cartridge for insertion into a compatible video game machine for interactive play with a human, in accordance with the steps of claim 1, wherein the predetermined event occurs upon expiration of a predetermined period of time set by the personal computer.

3. The method of manufacturing a video game within a cartridge for insertion into a compatible video game machine for interactive play with a human, in accordance with the steps of claim 1, wherein the step of downloading of the game content data occurs upon an occurrence of transmitting transactional data relating to the identifying indicia to the personal computer.

4. The method of manufacturing a video game within a cartridge for insertion into a compatible video game machine for interactive play with a human, in accordance with the steps of claim 1, wherein the step of downloading of the game content data includes a grant of an extra period of time to download.

5. The method of manufacturing a video game within a cartridge for insertion into a compatible video game machine for interactive play with a human, in accordance with the steps of claim 4, further including the step of uninterrupted downloading of the game content data upon an occurrence of transmitting transactional data relating to the identifying indicia to the personal computer.

6. The method of manufacturing a video game within a cartridge for insertion into a compatible video game machine for interactive play with a human, in accordance with the steps of claim 4, wherein the grant of an extra period of time includes the step of setting a password to extend a downloading time period of the game storage computer.

* * * * *